United States Patent
Hülsmann

(10) Patent No.: US 7,375,386 B2
(45) Date of Patent: May 20, 2008

(54) HETEROBIPOLAR TRANSISTOR

(75) Inventor: Axel Hülsmann, Freiburg (DE)

(73) Assignee: MergeOptics GmbH, Berlin (DE)

( * ) Notice: Subject to any disclaimer, the term of this patent is extended or adjusted under 35 U.S.C. 154(b) by 333 days.

(21) Appl. No.: 10/502,460

(22) PCT Filed: Jan. 24, 2003

(86) PCT No.: PCT/DE03/00257

§ 371 (c)(1), (2), (4) Date: Sep. 7, 2004

(87) PCT Pub. No.: WO03/063253

PCT Pub. Date: Jul. 31, 2003

(65) Prior Publication Data

US 2006/0108608 A1    May 25, 2006

(30) Foreign Application Priority Data

Jan. 25, 2002 (DE) ................ 102 03 965
Mar. 28, 2002 (DE) ................ 102 14 076

(51) Int. Cl.
*H01L 29/76* (2006.01)
(52) U.S. Cl. ............. 257/213; 257/194; 257/E51.014
(58) Field of Classification Search ............. 257/213, 257/194, E51.014
See application file for complete search history.

(56) References Cited

U.S. PATENT DOCUMENTS 5,041,882 A * 8/1991 Katoh ................ 257/198
5,679,965 A * 10/1997 Schetzina ................ 257/103

* cited by examiner

Primary Examiner—Andy Huynh
Assistant Examiner—Thinh T Nguyen
(74) Attorney, Agent, or Firm—Merchant & Gould

(57) ABSTRACT

The invention relates to a heterobipolar transistor, comprising an emitter which includes a first semiconductor layer (8) made of a first semiconductor material and a second semiconductor layer (9) made of a second semiconductor material, a band gap value of the first semiconductor material being smaller than a band gap value of the second semiconductor material. A semiconductor intermediate layer (10) made of an intermediate layer semiconductor material is disposed between the first semiconductor layer (9) and the second semiconductor layer (8) and a band gap value of the intermediate layer semiconductor material is greater than the band gap value of the first semiconductor material and smaller than the band gap value or the second semiconductor material. A potential barrier forms at the interface between two semiconductor materials having different band gap values and a stream of electrons must tunnel through it. It is easier for electrons jointly to tunnel through the energy barriers occurring at the interfaces of the semiconductor intermediate layer (10) than to tunnel through one energy barrier forming at an interface between the first semiconductor layer (9) and the second semiconductor layer (10) without an energy barrier generating semiconductor intermediate layer positioned between them. The resistance of the heterobipolar transistor emitter arrangement thus in lowered by the invention.

9 Claims, 4 Drawing Sheets

Fig. 4a
Fig. 4b
Fig. 4c
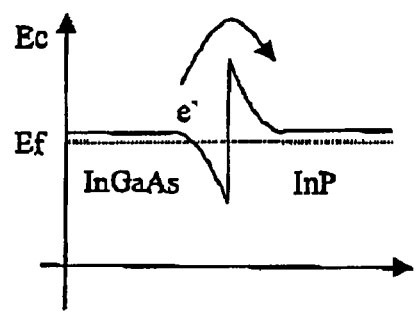
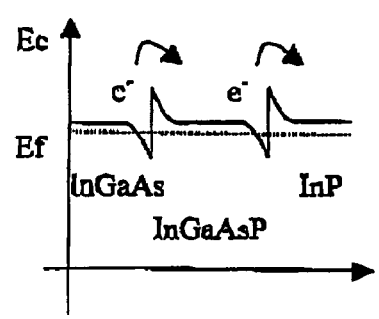
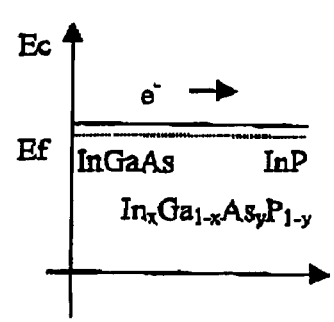

HETEROBIPOLAR TRANSISTOR

This application is a 371 of PCT/DE03/00257 Jan. 24, 2003

The invention relates to a heterobipolar transistor, comprising an emitter which includes a first semiconductor layer made of a first semiconductor material and a second semiconductor layer made of a second semiconductor material, a band gap value of the first semiconductor material being smaller than a band gap value of the second semiconductor material.

Heterobipolar transistors (HBT) have a number of advantages. In particular, their very good frequency behavior has led to increasing usage of heterobipolar transistors in high frequency circuits such as needed, for example, in mobile radio technology. Switching frequencies obtainable with heterobipolar transistors lie in a range above 100 GHz.

Heterobipolar transistors based on III-V semiconductor technology are used a lot. An emitter of a known n-p-n InP heterobipolar transistor comprises a sequence of adjacent semiconductor layers. A first $n^+$ doped emitter semiconductor layer has a small band gap value. InGaAs is an example of semiconductor material having a low band gap value. One face of the first emitter semiconductor layer is contacted metallically. The next adjacent emitter semiconductor layer is an $n^+$ doped semiconductor layer which has a greater band gap value. For example, InP and InAlAs are materials which have a high band gap value. The next $n^-$ doped emitter semiconductor layer made of the same semiconductor material with a great band gap value is located adjacent to a $p^+$ doped base layer having a small band gap value. Often InGaAs is used as the base layer material.

At the emitter-semiconductor interfaces InP/InGaAs and InAlAs/InGaAs, respectively, a discontinuity in the conduction band occurs, forming a thin, high barrier to the electrons. The conduction band electrons must tunnel trough this barrier. Such an energy barrier presents an obstacle to the electron flow and thus to the current flow. The energy barrier raises the emitter resistance, thereby limiting the maximum emitter current.

In electronics, heat is generated at every resistor through which current flows. Consequently, also the energy barrier, practically being a parasitic resistor of the emitter, entails higher power consumption of the heterobipolar transistor. Heating of transistors in operation is disadvantageous particularly with a view to circuit miniaturization. Furthermore, the parasitic resistance of the emitter lowers the maximum switching frequency of the transistor and leads to a higher noise level.

It is the object of the invention to provide an improved heterobipolar transistor having an emitter structure which lowers the parasitic resistance.

This object is met, in accordance with the invention, with a heterobipolar transistor of the kind specified initially, in that a semiconductor intermediate layer made of an intermediate layer semiconductor material is disposed between the first semiconductor layer and the second semiconductor layer and a band gap value of the intermediate layer semiconductor material in greater than the band gap value of the first semiconductor material and smaller than the band gap value of the second semiconductor material.

The emitter of a heterobipolar transistor according to the invention comprises at least two jumps in the band gap value, each smaller than the band gap difference between the band gap value of the first semiconductor layer and the band gap value of the second semiconductor layer. The energy barriers occurring between the first semiconductor layer and the semiconductor intermediate layer as well as between the semiconductor intermediate layer and the second semiconductor layer each are smaller than the energy barrier between the first semiconductor layer and the second semiconductor layer of a known heterobipolar transistor. As the tunneling probability of the electron through an energy barrier depends exponentially on the height of the barrier, the likelihood of tunneling through two small energy barriers is greater than the likelihood of tunneling through one big barrier the height of which equals the sum of the barrier heights of the two small barriers. The improved heterobipolar transistor thus has a smaller emitter resistance than known heterobipolar transistors.

In operation of the heterobipolar transistor, a reduced emitter resistance causes less heating and less power loss. Noise characteristics are improved and, furthermore, the maximum switching frequency of the heterobipolar transistor is increased.

It may be provided in an advantageous further development of the invention that the intermediate layer semiconductor material is lattice adapted to the first semiconductor material or/and the second semiconductor material. That has the advantageous consequence that no defects will form in the semiconductor intermediate layer or the first semiconductor layer or the second semiconductor layer. Defects in semiconductor material raise the parasitic resistance of the semiconductor material. The lattice adaptation, as shown, results in further reducing the emitter resistance.

Moreover, it may be advantageous that the band gap value of the intermediate layer semiconductor material corresponds to one half of the sum of the band gap value of the first semiconductor material and the band gap value of the second semiconductor material. That optimizes the probability of tunneling through the two barriers which appear at the interfaces of the semiconductor intermediate layer and, as a result, the emitter resistance brought about by the two energy barriers becomes minimal.

It may be provided according to further advantageous embodiments that the first semiconductor material comprises InGaAs, the second semiconductor material comprises InP, and the intermediate layer semiconductor material comprises InGaAsP, or that the first semiconductor material comprises InGaAs, the second semiconductor material comprises InAlAs, and the intermediate semiconductor material comprises AlGaInAs. That offers the possibility of varying the band gap value of the first semiconductor intermediate layer by varying the composition of the elements indium, gallium, arsenic, and phosphorus, or that of the elements aluminum, gallium, indium, and arsenic.

According to another advantageous further development of the invention it may De provided that a sequence of n ($n \geq 2$) stacked semiconductor intermediate layers constituted by the semiconductor intermediate layer and at least one other semiconductor layer made of another intermediate layer semiconductor material are disposed between the first semiconductor layer and the second semiconductor layer, that the at least one other semiconductor layer is disposed between the semiconductor intermediate layer and the second semiconductor layer, and that a band gap value of the other intermediate layer semiconductor material is greater than the band gap value of the intermediate layer semiconductor material and smaller than the band gap value of the second semiconductor material. The advantage hereof is that at least three energy barriers are presented in the emitter. Tunneling through at least three barriers is more likely than tunneling through two barriers if the sum of the barrier heights of the at least three energy barriers corresponds to the sum of the barrier heights of the two energy barriers. Therefore, a heterobipolar transistor including an emitter which has a semiconductor intermediate layer and at least one more semiconductor intermediate layer is distinguished from an HTB with but one semiconductor intermediate layer by having a smaller emitter resistance.

In a convenient further development or the invention it may be provided that the first semiconductor material has a band gap value Be, the second semiconductor material has a band gap value Bz, and an intermediate layer semiconductor material of a $j^{th}$ of the n semiconductor intermediate layers ($2 \leq j \leq n$) has a band gap value Bj, where Bj=Be+j'(1/(1+n))'(Bz–Be). This optimizes the overall tunneling probability of an electron in an emitter of a heterobipolar transistor which comprises n semiconductor intermediate layers.

It is provided in yet another further development of the invention that the number n of the semiconductor intermediate layers constituting the sequence is selected such that a quasi linear transition is obtained between the band gap value of the first semiconductor material and the band gap value of the second semiconductor material due to the band gap values of the intermediate layer semiconductor materials disposed between the first semiconductor material and the second semiconductor material. Because of these differences in band gap values, such a heterobipolar transistor has a minimal emitter resistance.

It may be provided in an embodiment of the invention that the first semiconductor layer is contacted metallically. The metallic contacting permits the emitter current of the heterobipolar transistor to be carried off.

In a convenient modification provision may be made for a further semiconductor layer to border on the second semiconductor layer, and the further semiconductor layer to border on a base. That offers the possibility of the further semiconductor layer bordering on the base to have a doping different from that of the second semiconductor layer.

The invention will be described further, by way of example, with reference to a drawing, in which:

FIG. 4a shows the diagrammatic course of the conduction band of a conventional emitter;

FIG. 4b shows the diagrammatic course of the conduction band of an emitter graded by steps, and FIG. 4c shows the diagrammatic course of the conduction band of an emitter graded homogeneously.

Figure 1:
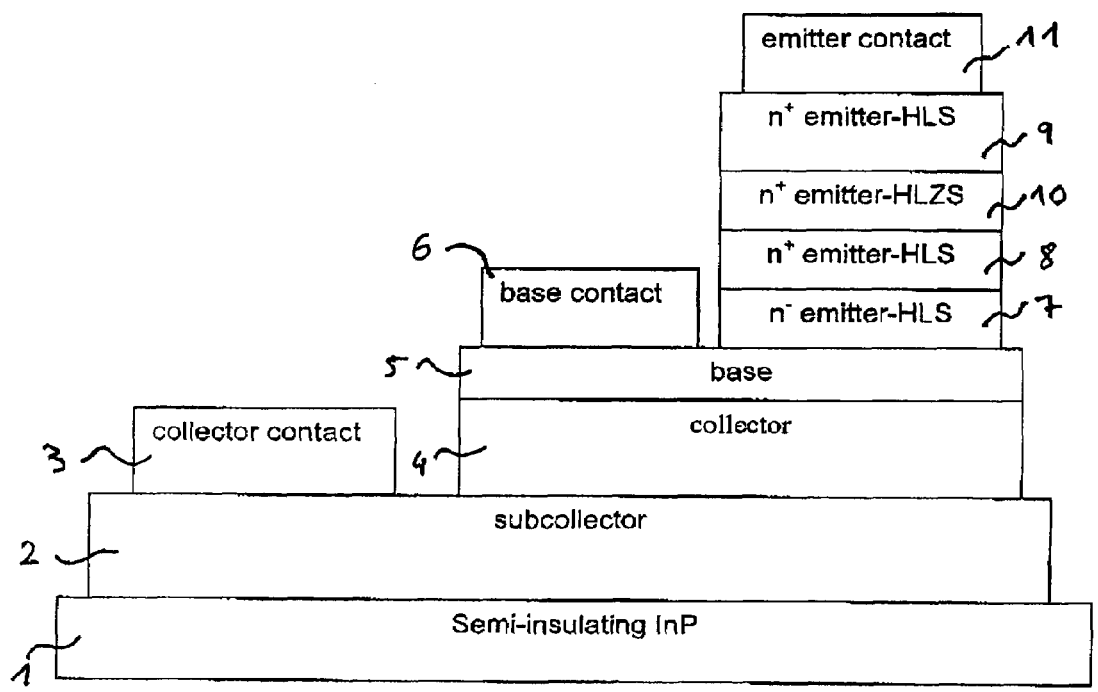
FIG. 1 is a diagrammatic cross section of an n-p-n heterobipolar transistor with an emitter which is graded by steps.

FIG. 1 diagrammatically shows an n-p-n heterobipolar transistor of which the emitter is graded stepwise. A heterobipolar transistor comprises a plurality of layers which are epitaxially grown one on top of the other. A subcollector 2 is disposed on a semi-insulating InP layer 1. A collector contact 3 and a collector 4 border on the subcollector 2. A $p^-$ doped base layer 5 borders on the collector 4. A face of the base layer 5 remote from the collector comprises a base contact 6 and an interface with an n doped emitter semiconductor layer 7 (semiconductor layer HLS). As a rule, the base layer comprises a semiconductor material which has a small band gap value, for instance, InGaAs. The $n^-$ doped emitter semiconductor layer 7 comprises a semiconductor material having a great band gap value. Such materials, for example, are InP and InAlAs. The n doped emitter semiconductor layer 7 is followed by an $n^+$ doped emitter semiconductor layer 8 comprising a semiconductor material whose band gap value is great. Normally, the semiconductor materials of the $n^-$ doped emitter semiconductor layer 7 and the $n^+$ doped emitter semiconductor layer 8 are identical. An $n^+$ doped emitter semiconductor intermediate layer 10 (semiconductor intermediate layer HLZS) is arranged between the $n^+$ doped emitter semiconductor layer 8 which has the great band gap value and an n doped emitter semiconductor layer 9 which has a small band gap value and also is the last one of the stacked, epitaxially grown emitter layers. The band gap value of the emitter semiconductor intermediate layer 10 is greater than the band gap value of the $n^+$ doped emitter semiconductor layer 9 having the small band gap value, and is smaller than the band gap value of the $n^+$ doped emitter semiconductor layer 8 having the great band gap value. A metallic emitter contact 11 is disposed on one face of the $n^+$ doped emitter semiconductor layer 9.

Figure 2:
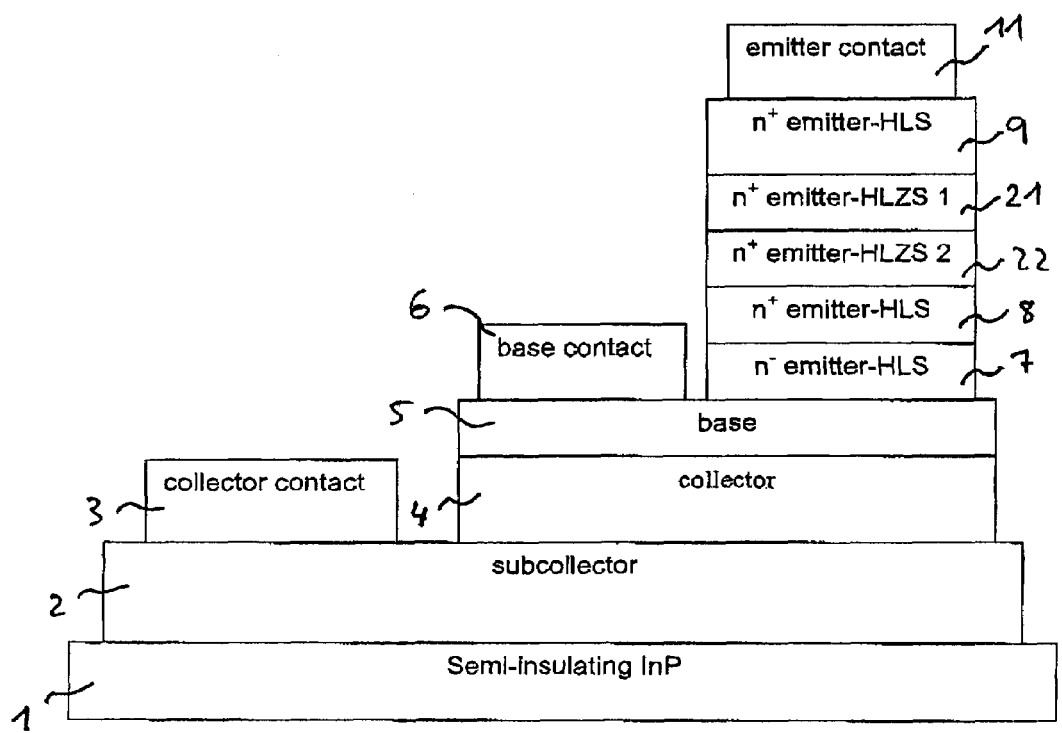
FIG. 2 is a diagrammatic cross section of another embodiment of an n-p-n heterobipolar transistor with an emitter graded by steps.

The embodiment shown in FIG. 2 of an n-p-n heterobipolar transistor comprising a emitter graded by steps differs from the embodiment illustrated in FIG. 1 by the provision of two emitter semiconductor layers 21, 22 between the emitter semiconductor layer 9 which has the small band gap value and the emitter semiconductor layer 8 which has the great band gap value. More specifically, the band gap values are the following: the band gap value of the emitter semiconductor intermediate layer 21 is greater than the band gap value of the emitter semiconductor layer 9 and smaller than the band gap value of the emitter semiconductor intermediate layer 22. The band gap value of the emitter semiconductor intermediate layer 22 in turn is greater than the band gap value of the emitter semiconductor intermediate layer 21 and smaller than the band gap value of the emitter semiconductor layer 8. The two emitter semiconductor intermediate layers either may comprise different semiconductor materials or the same semiconductor material.

Figure 3:
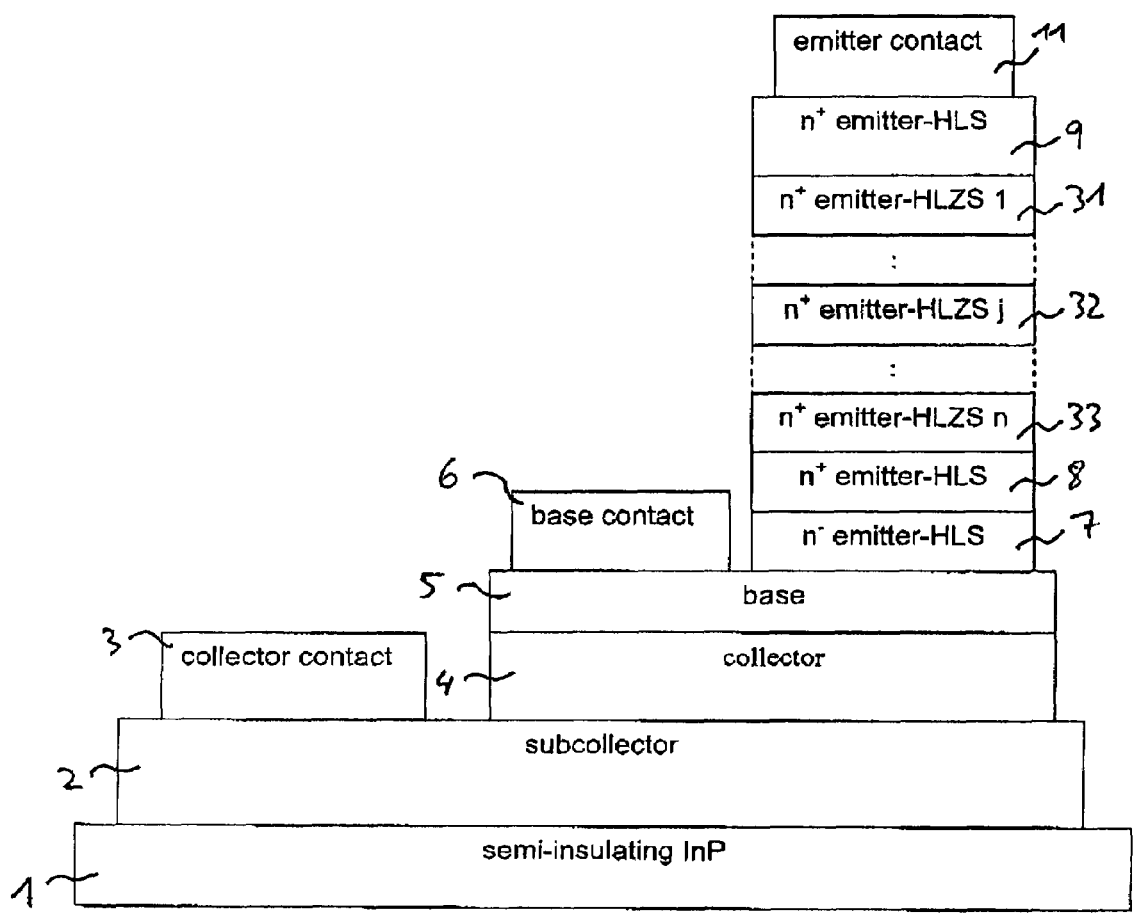
FIG. 3 is a diagrammatic cross selection of another embodiment of an n-p-n heterobipolar transistor with an emitter graded by steps.

FIG. 3 shows another embodiment of a heterobipolar transistor. With this embodiment a sequence of n($n \geq 2$) emitter semiconductor intermediate layers 31, 32, 33 is disposed between the $n^+$ doped emitter semiconductor intermediate layer 9 having the small band gap value and the $n^+$ doped emitter semiconductor intermediate layer 8 having the great band gap value. A $j^{th}$ emitter semiconductor intermediate layer 32 ($1 \leq j \leq n$) has a band gap value Bj, where: Bj–1$\leq$Bj$\leq$Bj+1, B0 being a band gap value of the emitter semiconductor layer 9 with the small band gap value, and Bn+1 being a bend gap value of the emitter semiconductor layer 8 with the great band gap value. As in the case of the embodiment shown in FIG. 2, the emitter semiconductor intermediate layers 31, 32, 33 may either comprise different semiconductor materials or the same semiconductor material.

A conduction band discontinuity occurs in a known heterobipolar transistor at an interface between the $n^+$ doped semiconductor layer having a great band gap value and an $n^+$ doped semiconductor layer having a small band gap value. FIG. 4a illustrates such a schematic course of the conduction band. In this case InGaAs in a semiconductor material with a small band gas value, while InP is a semiconductor material with a great band gap value. In operation, electrons must tunnel through the energy barrier shown.

FIG. 4b illustrates the course of the conduction band of an emitter graded by steps, such as shown in FIG. 1, including an emitter semiconductor intermediate layer 10. In this embodiment the emitter semiconductor layer 9 with the small band gap value comprises InGaAs, the emitter semiconductor intermediate layer 10 comprises InGaAsP, and the emitter semiconductor layer 8 with the great band gap value comprises InP. In the embodiment illustrated, the band gap value of the emitter semiconductor intermediate layer 10, InGaAsP, corresponds to one half of the gum of the band gap value of the emitter semiconductor layer 9, InGaAs, which has the small band gap value, and the band gap value of the emitter semiconductor layer 8, InP, which has the great band gap value. Two thin energy barriers are established at the two interfaces of the emitter semiconductor intermediate layer 10, InGaAsP. Their barrier heights are half as great an the barrier height of the energy barrier illustrated in FIG. 4a. In view of the fact that the barrier height enters exponentially in the tunnel probability, it is more likely for an electron to tunnel through two energy barriers of half the height than through one energy barrier having the full height. For this reason, an emitter which is graded by steps has a lower resistance value than an emitter of a known HBT.

In an advantageous further development of the embodiment shown in FIG. 1, provision may be made for the band gap value of the emitter semiconductor intermediate layer to be a band gap value of which the difference with respect to the $n^+$ doped emitter semiconductor layer having the small band gap value is smaller/greater than the difference with repect to the band gap value of the emitter semiconductor layer having the great band gap value. With this embodiment, the resulting energy barriers at the interfaces of the emitter semiconductor intermediate layer have different heights. That permits the resistance value of the emitter to be varied.

With the embodiments according to FIGS. 2 and 3, discontinuities occur in the band gap values at more than two interfaces of the emitter. This means that the height of the energy barrier encountered in an emitter of a known HTB is "distributed" to the greater number of small barriers, the total of the small barrier heights providing an overall barrier height which equals the energy barrier height in a known emitter. The "distribution" of the overall barrier height to a greater number of smaller barriers further reduces the overall tunneling probability of a electron through all the energy barriers.

In an advantageous further development of the embodiment shown in FIG. 3, provision may be made for the difference between the band gap values of two adjacent emitter semiconductor layers to be 1/(n+1)th of the difference of the band gap value of the emitter semiconductor layer which has the great band gap value and the band gap value of the emitter semiconductor layer which has the small band gap value.

If the number n of the emitter semiconductor intermediate layers is chosen big enough, the result will be a homogeneously graded emitter. FIG. 4c shows the schematic course of the conduction band of such a homogeneously graded emitter. The share of the resistance of the emitter resistance derivable from the variation of the band gap value along the emitter becomes minimal in a homogeneously graded emitter. A quasi linear transition of the band gap values along the emitter semiconductor intermediate layers, from the band gap value of the emitter semiconductor layer with the small band gap value to the emitter semiconductor layer with the great band gap value, can be obtained with a homogeneously graded emitter.

It is of advantage for all the embodiments described above to have each of the emitter semiconductor layers lattice adapted as beet as possible to the respective adjacent emitter semiconductor layers or emitter semiconductor intermediate layers. That prevents defects from occurring at the interfaces and in the emitter semiconductor intermediate layers or emitter semiconductor layers, defects which would cause parasitic resistance in the emitters.

The semiconductor materials mentioned in the description above are no more than examples. A conceivable embodiment may comprise InGaAs as the emitter semiconductor layer having the small band gap value, AlGaInAs as the emitter semiconductor layer having the great band gap value, and AlInAs as the emitter semiconductor layer having the great band gap value. It will be apparent to the skilled reader that the emitter semiconductor layers or emitter semiconductor intermediate layers likewise may comprise other materials, e.g. GaAs and SiGe, etc.

As described above, the invention provides a heterobipolar transistor including an emitter of which the emitter resistance is small in comparison with the emitter resistance of heterobipolar transistors known in the art. This lowering of the emitter resistance reduced power consumption, self-heating, and noise in a circuit in which heterobipolar transistors are employed. Furthermore, the reduction of the emitter resistance leads to a higher cutoff frequency and switching frequency of the heterobipolar transistor.

The features of the invention disclosed in the specification above, in the drawing and claims may be significant for implementing the invention in its various embodiments, both individually and in any combination.

What is claimed is:

1. A heterobipolar transistor, comprising an emitter which includes a first semiconductor layer (9) made of a first semiconductor material and a second semiconductor layer (8) made of a second semiconductor material, a band gap value or the first semiconductor material being smaller than a band gap value or the second semiconductor material, characterized in that:

a sequence of n (n≧2) stacked semiconductor intermediate layers (31, 32, 33) constituted by the semiconductor intermediate layer (31) and at least one other semiconductor layer (32) made of another intermediate layer semiconductor material are disposed between the first semiconductor layer (9) and the second semiconductor layer (8), that the at least one other semiconductor layer (32) is disposed between the semiconductor intermediate layer (31) and the second semiconductor layer (8);

a band gap value of the intermediate layer semiconductor material is greater than the band gap value of the first semiconductor material and smaller than the band gap value of the second semiconductor material;

The at least one other semiconductor layer (32) is disposed between the semiconductor intermediate layer (31) and the second semiconductor layer (8); and A band gap value of the other intermediate layer semiconductor material is greater than the band gap value of the intermediate layer semiconductor material and smaller than the band gap value of the semiconductor material.

2. The heterobipolar transistor as claimed in claim 1, characterized in that the intermediate layer semiconductor material is lattice adapted to the first semiconductor material and/or the second semiconductor material.

3. The heterobipolar transistor as claimed in claim 2, characterized in that the band gap value of the intermediate layer semiconductor material equals half the sum of the band gap value of the first semiconductor material plus the band gap value of the second semiconductor material.

4. The heterobipolar transistor al claimed in claim 1, characterized in that the first semiconductor material comprises InGaAs, the second semiconductor material comprises InP, and the intermediate layer semiconductor material comprises InGaAsP.

5. The heterobipolar transistor as claimed in claim 1, characterized in that the first semiconductor material comprises InGaAs, the second semiconductor material comprises InAlAs, and the intermediate layer semiconductor material comprises AlGaInAs.

6. The heterobipolar transistor as claimed in claim 1, characterized in that the first semiconductor material has a band gap value Be, the second semiconductor material has a band gap value Bz, and an intermediate layer semiconductor material of a $j^{th}$ of the n semiconductor intermediate layers ($2 \leq j \leq n$) has a band gap value Bj, where $Bj = Be + j \cdot (1/(1+n)) \cdot (Bz - Be)$.

7. The heterobipolar transistor as claimed in claim 6, characterized in that the number n of the semiconductor intermediate layers (31, 32, 33) constituting the sequence is selected such that a quasi linear transition is obtained between the band gap value of the first semiconductor material and the band gap value of the second semiconductor material due to the band gap values of the intermediate layer semiconductor materials disposed between the first semiconductor material and the second semiconductor material.

8. The heterobipolar transistor as claimed in claim 1, characterized in that a further semiconductor layer (7) borders on the second semiconductor layer (8) at a side remote from the semiconductor intermediate layers and that the further semiconductor layer (7) borders on the base (5).

9. The heterobipolar transistor as claimed in claim 1, characterized in that the first semiconductor layer is contacted metallically.

* * * * *